(12) United States Patent
Goto et al.

(10) Patent No.: US 10,414,661 B2
(45) Date of Patent: Sep. 17, 2019

(54) METHOD OF PRODUCING SILICON HYDRIDE OXIDE-CONTAINING SOLVENT

(71) Applicant: Thin Film Electronics ASA, Oslo (NO)

(72) Inventors: Yuichi Goto, Toyama (JP); Masahisa Endo, Toyama (JP); Gun Son, Toyama (JP); Kentaro Negai, Funabashi (JP)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 15/523,921

(22) PCT Filed: Oct. 13, 2015

(86) PCT No.: PCT/JP2015/078922
§ 371 (c)(1),
(2) Date: May 2, 2017

(87) PCT Pub. No.: WO2016/072226
PCT Pub. Date: May 12, 2016

(65) Prior Publication Data
US 2017/0313592 A1 Nov. 2, 2017

(30) Foreign Application Priority Data

Nov. 4, 2014 (JP) .................................. 2014-224513

(51) Int. Cl.
*C01B 33/113* (2006.01)
*C08G 77/60* (2006.01)
(Continued)

(52) U.S. Cl.
CPC .......... *C01B 33/113* (2013.01); *B01J 23/464* (2013.01); *C01B 33/04* (2013.01); *C08G 77/60* (2013.01);
(Continued)

(58) Field of Classification Search
CPC ...... C01B 33/113; C01B 33/04; B01J 23/464; C08G 77/60; C09D 183/16; H01L 21/02107
See application file for complete search history.

(56) References Cited

U.S. PATENT DOCUMENTS 4,554,180 A    11/1985   Hirooka
6,027,705 A    2/2000    Kitsuno et al.
(Continued)

FOREIGN PATENT DOCUMENTS

JP    60-26664       2/1985
JP    11-260729 A    9/1999
(Continued)

OTHER PUBLICATIONS

JP 2005-22964 Machine Translation.*
(Continued)

*Primary Examiner* — James A Fiorito
(74) *Attorney, Agent, or Firm* — Andrew D. Fortney; Central California IP Group, P.C.

(57) ABSTRACT

A method of producing a silicon hydride oxide-containing organic solvent (coating solution) is provided with which a silicon hydride oxide coating film can be formed on a substrate. Using the silicon hydride oxide-containing organic solvent makes it unnecessary to place a coating solution in non-oxidizing atmosphere at the time of coating or to heat the substrate after coating because the silicon hydride oxide is formed in the coating solution before it is coated. The method includes blowing an oxygen-containing gas through an organic solvent containing a silicon hydride or a polymer thereof. The silicon hydride oxide may contain a proportion of (residual Si-H groups)/(Si-H groups before oxidation) of 1 to 40 mol %. The silicon hydride can be obtained by reacting a cyclic silane with a hydrogen halide in the presence of an aluminum halide, and reducing the obtained cyclic halosilane.

16 Claims, 3 Drawing Sheets

(51) Int. Cl.
*B01J 23/46* (2006.01)
*C01B 33/04* (2006.01)
*H01L 21/02* (2006.01)

(52) U.S. Cl.
CPC .... *H01L 21/0217* (2013.01); *H01L 21/02214* (2013.01); *H01L 21/02282* (2013.01)

(56) References Cited

U.S. PATENT DOCUMENTS

| | | |
|---|---|---|
| 2006/0159859 A1 | 7/2006 | Iwasawa |
| 2009/0215920 A1 | 8/2009 | Iwasawa et al. |
| 2013/0026453 A1 | 1/2013 | Kunze et al. |

FOREIGN PATENT DOCUMENTS

| | | |
|---|---|---|
| JP | 2005022964 A | 1/2005 |
| WO | 2013019208 A1 | 2/2013 |

OTHER PUBLICATIONS

JP 11-260729 Machine Translation.*
International Search Report (with English translation) and Written Opinion; dated Nov. 17, 2015; International Application No. PCT/JP2015/078922; 9 pages; International Searching Authority/Japanese Patent Office; Tokyo, Japan.

* cited by examiner

METHOD OF PRODUCING SILICON HYDRIDE OXIDE-CONTAINING SOLVENT

TECHNICAL FIELD

The present invention relates to cyclic silane and a production method thereof. The present invention relates to a silane polymer that is applied to uses in integrated circuits, thin film transistors and the like.

RELATED ART

Silicon semiconductors are a material that has been examined as a material for a thin film transistor (TFT) and solar cells from long ago.

Patterning of a silicon thin film applied to integrated circuits and thin film transistors is generally performed by forming a silicon film by vacuum processes such as CVD. This poses issues that, for example, because such devices employ vacuum processes, they have to be large-scale ones, and raw materials are gases, which are hard to handle.

As a solution to these issues, there is a technique of applying onto a substrate a silane polymer dissolved in an organic solvent and, after firing, forming a silicon film by dehydrogenation.

On the other hand, as an insulating film of a semiconductor, a silicon oxide film is widely used. For example, a patent document discloses, a method of forming a silicon oxide film by forming a coating film containing a polysilane compound expressed by SinRm (n is an integer of 3 or larger, and m is an integer of n to 2n+2. R is a hydrogen atom, an alkyl group, a phenyl group or a halogen) in non-oxidizing atmosphere, and then oxidizing the coating film (please see Patent Document 1).

PRIOR ART DOCUMENT

Patent Document

Patent Document 1: Japanese Patent Application Publication No. 2002-246384

SUMMARY OF INVENTION

Problems to be Solved by Invention

In a conventionally used method in which a solution containing a silane compound is applied onto a substrate in non-oxidizing atmosphere, and an oxide to be an oxide film is formed on the substrate, it is necessary to employ non-oxidizing atmosphere at the step of coating, and furthermore oxidation by heating in the atmosphere is performed on the substrate in some cases; therefore, damages to the substrate caused by the heating are considerable. Also, there has been an issue that because substrates that can be used are limited to highly heat-resistant substrates such as silicon, quartz or glass, it is difficult to apply the method to less heat-resistant substrates such as plastic. Also, there has been an issue that the attainable oxidation purity is low because it is difficult to oxidize a silane compound in a solution on a substrate sufficiently.

An object of the present invention is to provide a method of producing a silicon hydride oxide-containing organic solvent with which a silicon hydride oxide coating film can be formed on a substrate. Using the silicon hydride oxide-containing organic solvent makes it unnecessary to place the substrate in non-oxidizing atmosphere at the time of coating of the substrate or to perform heat treatment on the substrate after the coating because a silicon hydride oxide is formed in the coating solution before the coating. The oxide coating film on the substrate generated according to the present invention may be used as an electrical insulating film.

Means for Solving Problems

A first aspect of the present invention provides a method of producing a silicon hydride oxide-containing organic solvent including: blowing an oxygen-containing gas on an organic solvent containing a silicon hydride or a polymer thereof.

A second aspect provides the method of producing a silicon hydride oxide-containing organic solvent according to the first aspect, wherein the silicon hydride is cyclic silane.

A third aspect provides the method of producing a silicon hydride oxide-containing organic solvent according to the first aspect, wherein the silicon hydride is cyclopentasilane.

A fourth aspect provides the method of producing a silicon hydride oxide-containing organic solvent according to the first aspect, wherein the silicon hydride oxide-containing organic solvent contains an oxide of the silicon hydride or the polymer thereof at a proportion of (residual Si—H groups)/(Si—H groups before oxidation)=1 to 40 mol %.

A fifth aspect provides the method of producing a silicon hydride oxide-containing organic solvent according to the first aspect, wherein as the silicon hydride, cyclic silane obtained by a method having Process (A) and Process (B) is used, Process (A) is a process of obtaining a solution containing cyclic silane expressed by Formula (2):

[Chemical Formula 2]

$$(SiR^3R^4)n \qquad \text{Formula (2)}$$

(where in Formula (2), $R^3$ and $R^4$ respectively indicate halogen atoms, and n is an integer of 4 to 6) by causing cyclic silane expressed by Formula (1):

[Chemical Formula 1]

$$(SiR^1R^2)n \qquad \text{Formula (1)}$$

(where in Formula (1), $R^1$ and $R^2$ respectively indicate independently hydrogen atoms, C1 to C6 alkyl groups, or optionally substituted phenyl groups ($R^1$ and $R^2$ are not hydrogen atoms simultaneously), n is an integer of 4 to 6) to react with a hydrogen halide in cyclohexane in the presence of an aluminum halide, and Process (B) is a process of obtaining cyclic silane expressed by Formula (3):

[Chemical Formula 3]

$$(SiH_2)n \qquad \text{Formula (3)}$$

(where in Formula (3), n is an integer of 4 to 6) by dissolving the cyclic silane expressed by Formula (2) in an organic solvent and reducing the cyclic silane with hydrogen or a lithium aluminum hydride.

A sixth aspect provides the method of producing a silicon hydride oxide-containing organic solvent according to the fifth aspect, wherein after obtaining the solution containing the cyclic silane expressed by Formula (2), Process (A) includes a process of obtaining the cyclic silane expressed by Formula (2) by further distilling the solution.

A seventh aspect provides the method of producing a silicon hydride oxide-containing organic solvent according to the first aspect, wherein the polymer of the silicon hydride used is generated by contact between the silicon hydride and metallic rhodium in an inert gas.

An eighth aspect provides the method of producing a silicon hydride oxide-containing organic solvent according to any one of the first aspect to the seventh aspect, wherein the oxygen-containing gas is air.

Effects of Invention

Conventionally, a method in which a silane compound solution containing a Si—H group is applied onto a substrate in non-oxidizing atmosphere and an oxide is formed on the substrate has been performed. The method requires a device that generates non-oxidizing atmosphere, and because oxidation by heating in the atmosphere is performed on the substrate, damages to the substrate caused by the heating are considerable. There has been an issue that because substrates that can be used are limited to highly heat-resistant substrates such as silicon, quartz or glass, it is difficult to apply the method to less heat-resistant substrates such as plastic. Also, the attainable oxidation purity is low in some cases because it is difficult to oxidize a silane compound on a base material sufficiently.

Because in the present invention, it is not necessary to place a substrate in non-oxidizing atmosphere at the time of coating of the substrate with a solution because an oxide is formed in the solution before the coating, and it is not necessary to perform heat treatment on the substrate after the coating. Even if oxidation is performed after the coating, it does not require strict conditions. Even on a base material that requires a process to be performed at low temperature, an oxide coating film may be formed easily. The oxide coating film generated on the substrate may be used as an electrical insulating film.

The present invention relates to a production method about a solution in which an oxide is dissolved in an organic solvent, the oxide being obtained by converting a Si—H group of a silicon hydride into an oxidized chemical group such as a Si—O group by blowing an oxygen-containing gas on the organic solvent containing the silicon hydride or a polymer thereof.

That is, because the silicon hydride is oxidized in the solution, the oxidation can proceed sufficiently. Also, because the obtained oxide is present in the solution beforehand, the compatibility of it with the solvent is high, and the formed oxide can be present therein stably without undergoing precipitation.

EMBODIMENTS FOR IMPLEMENTING INVENTION

Figure 1:
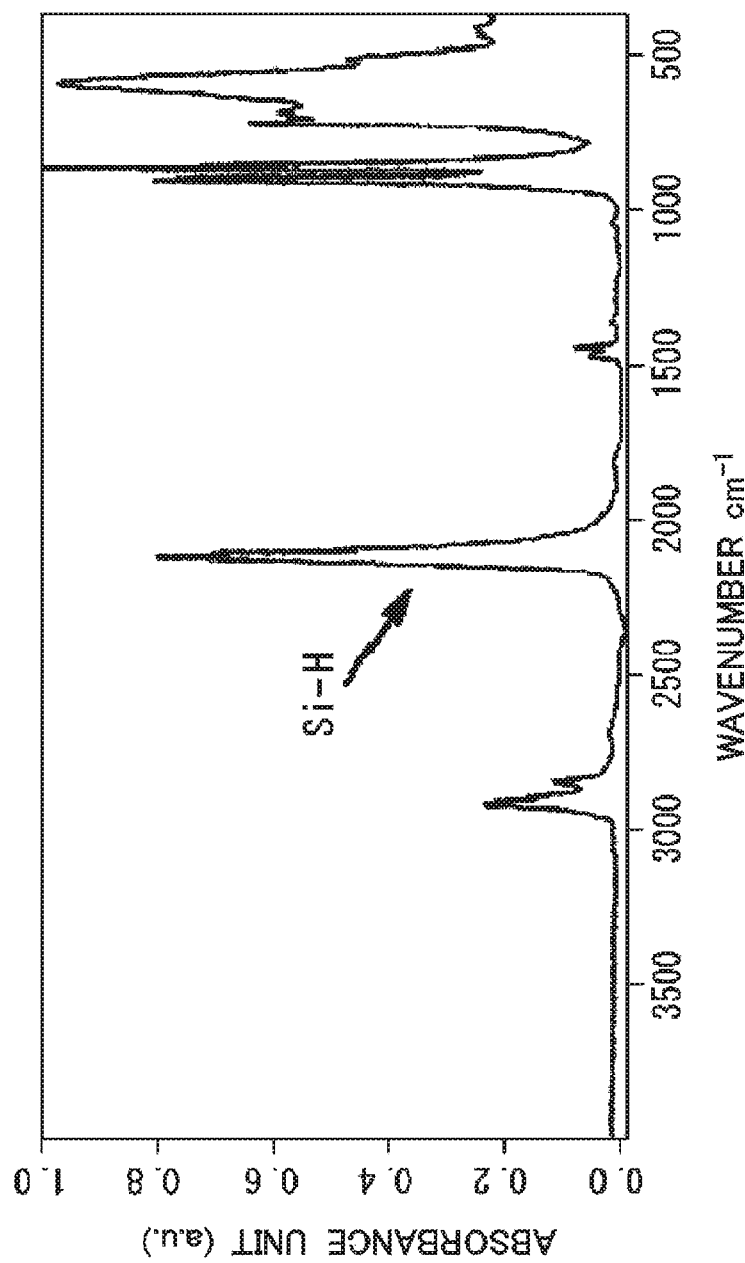
FIG. 1 shows an IR (infrared absorption spectrum) chart before oxidation of cyclopentasilane polymer in Example 1.

The present invention is a method of producing a silicon hydride oxide-containing organic solvent including: blowing an oxygen-containing gas on an organic solvent containing a silicon hydride or a polymer thereof.

Specifically, oxidation is caused to occur in a solution in which a silicon hydride or a polymer thereof is dissolved in an organic solvent at a proportion of 0.01 to 50% by mass or preferably 1 to 10% by mass; as a result, an organic solvent containing an oxide of the silicon hydride or the polymer thereof at a similar concentration, i.e., 0.01 to 50% by mass or preferably 1 to 10% by mass, may be obtained.

Examples of the organic solvent include: a hydrocarbon-based solvent such as n-hexane, n-heptane, n-octane, n-decane, cyclohexane, cyclooctane, dicyclopentane, benzene, toluene, xylene, duren, indene, tetrahydronaphthalene; decahydronaphthalene or squalane; an ether-based solvent such as dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-Dimethoxyethane, bis(2-methoxyethyl)ether, or p-dioxane; and furthermore propylene carbonate, γ-butyrolactone, N-methyl-2-pyrrolidone, dimethyl formamide, acetonitrile, dimethyl sulphoxide, etc. Among the examples of the solvent, cyclohexane and cyclooctane may be used preferably.

An oxygen gas may be singly used as the oxygen-containing gas in the present invention. Also, a mixed gas containing oxygen and another gas may be used. Examples of the mixed gas include air. Air is preferably used in order to prevent rapid oxidation. The amount of air blown may correspond to an oxygen amount no less than a chemical equivalent relative to silicon hydride, and normally a gas containing an excess amount of oxygen is blown.

For example, an oxygen-containing gas (for example, air) may be blown on 1 to 50 g or preferably 5 to 30 g of a solution of a silicon hydride dissolved in an organic solvent at a proportion of 1 to 20% by mass or 1 to 10% by mass at a rate of 1 to 300 ml/minute or preferably 10 to 150 ml/minute. The duration of oxidation varies depending on the proportion to be oxidized, and the oxidation may be performed for example approximately for 0.1 to 100 hours or preferably 0.1 to 10 hours.

A production device used in a production method of the present invention includes, in a vessel containing an organic solvent containing a silicon hydride or a polymer thereof, a tube through which an oxygen-containing gas is introduced, and a gas is introduced into the organic solvent from a nozzle at a tip of the tube. During the introduction of the gas, the organic solvent is preferably being agitated, and an agitation device may be attached to the vessel. In this manner, an oxidation reaction of the silicon hydride or the polymer thereof occurs, and the organic solvent containing an oxide of the silicon hydride or the polymer thereof can be produced.

The silicon hydride used may be cyclic silane. In particular, the silicon hydride used may be cyclopentasilane.

The obtained oxide of the silicon hydride or the polymer thereof may be formed to have a proportion which is calculated by (residual Si—H groups)/(Si—H groups before oxidation) of 1 to 40 mol %, or preferably 5 to 40 mol %, or more preferably 10 to 40 mol %, or still more preferably 10 to 30 mol %, or furthermore 20 to 30 mol %. Si atoms other than the residual Si—H groups are assumed to be forming oxide structures such as Si—O, but structures formed by bonds between Si atoms and halogen atoms or structures formed by bonds between Si atoms and a phenyl group may be contained as impurities. If the value is lower than 1 mol %, there is deposition of a trace amount of oxide or the like, and therefore such a value is not preferable. Also, if the value exceeds 40 mol %, oxidation has not occurred sufficiently, and therefore if a resultant matter is used for coating, sufficient electric insulation cannot be achieved.

The silicon hydride used in the present invention may be produced by processes including Process (A) and Process (B). In Process (A), examples of the C1 to C6 alkyl group that appear in the definition of the groups $R^1$ and $R^2$ in the cyclic silane expressed by Formula (1) include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl cyclopropyl group, an n-pentyl group, etc. Furthermore, in the optionally substituted phenyl group, examples of the substituent include the alkyl group. n is an integer of 4 to 6, and preferably only cyclic silane in which n=5 is used or alternatively cyclic silane in which n=5 may be used as a major component. If $R^1$ and $R^2$ are phenyl groups, cyclic silane in which n=5 is decaphenylcyclopentasilane, and decaphenylcyclopentasilane may be preferably used as a raw material. Cyclic silane in which n=4 or n=6 may also be contained.

In Process (A), the cyclic silane expressed by Formula (1) and halogen or a hydrogen halide may be caused to undergo a reaction to synthesize the cyclic silane expressed by Formula (2). Also, after obtaining a solution containing the cyclic silane, it may be distilled to obtain the cyclic silane expressed by Formula (2). Distillation at Process (A) is performed at a temperature of 40 to 80° C. and a degree of pressure reduction of 0 to 30 Torr (for example, 1 to 30 Torr, or 5 to 30 Torr) for 2 to 24 hours. At that time, a reaction may be cause to occur in an organic solvent (for example, cyclohexane, hexane, heptane, toluene benzene) with an aluminum halide (for example, aluminum chloride, aluminum bromide) as a catalyst. The amount of the hydrogen halide (for example, hydrogen chloride) required is 2n moles or more relative to the cyclic silane, and for example may be 2.5n moles to 3.5n moles, and an excess amount of it may be added. The catalyst may be added at a proportion of 0.01 moles to 2 moles per mole of cyclic silane. If hydrogen chloride is used at Process (A), $R^3$ and $R^4$ in Formula (2) are chlorine atoms.

At Process (B), the cyclic silane expressed by Formula (3) is obtained by reducing the cyclic silane expressed by Formula (2) with hydrogen or a lithium aluminum hydride.

At Process (B), the compound expressed by Formula (2) is dissolved in the organic solvent (for example, cyclohexane, hexane, heptane, toluene, benzene), and a lithium aluminum hydride dissolved in ether (for example, diethyl ether, tetrahydrofuran, cyclopentimethyl ether) is slowly added thereto to reduce the cyclic silane expressed by Formula (2); thereby, the cyclic silane expressed by Formula (2) may be converted into the cyclic silane expressed by Formula (3). The lithium aluminum hydride added at this time may be added at a proportion of 2 to 3 moles per mole of the cyclic silane expressed by Formula (2). Although in Formula (3), n is an integer of 4 to 6, cyclopentasilane in which n is 5 is preferably contained at a proportion of no less than 80 mol %, for example 80 to 100 mol %, and more preferably 90 to 100 mol % in the entire silane to be obtained. In particular, cyclopentasilane preferably of high-purity (100 mol %) is preferably obtained.

Furthermore, as Process (C), a process of adding a polymerization inhibitor to the cyclic silane expressed by Formula (3) and distilling Formula (3) may be performed. Distillation at Process (C) is performed at a temperature of 20 to 70° C. and at a degree of pressure reduction of 1 to 50 Torr (for example, 1 to 35 Torr, or still more preferably 2 to 50 Torr) for 4 to 6 hours.

The cyclic silane expressed by Formula (1) used as a raw material at the time of synthesizing cyclopentasilane mentioned above may be a commercial product. Also, if the synthesis is performed, a compound expressed by Formula (a):

[Chemical Formula 4]

   Formula (a)

(where in Formula (a), $R^1$ and $R^2$ respectively indicate independently hydrogen atoms, C1 to C6 alkyl groups, or optionally substituted phenyl groups ($R^1$ and $R^2$ are not hydrogen atoms simultaneously), and X indicates a halogen atom) may be caused to undergo a reaction in the organic solvent in the presence of an alkali metal; thereby, the cyclic silane expressed by Formula (1) may be obtained.

Here, examples of the C1 to C6 alkyl groups and the optionally substituted phenyl groups include the above-mentioned examples. Examples of the halogen atoms include fluorine, chlorine, bromine and iodine, and chlorine may be used preferably. The alkali metal is lithium, sodium, potassium or the like. If the alkali metal is dispersed in an organic solvent such as tetrahydrofuran, and furthermore the silane expressed by Formula (a) is added thereto, the cyclic silane expressed by Formula (1) is generated. The amount of the alkali metal used at this time is, in the unit of mole, approximately 1.5 to 3 times that of the silane expressed by Formula (a). This reaction occurs at room temperature, and an obtained product undergoes recrystallization or the like.

Examples of silane expressed by Formula (a) include diphenyldichlorosilane, diphenyldibromosilane, diphenyldiiodosilane, di(phenyl chloride)dichlorosilane, dimethyldichlorosilane, dimethyldibromosilane, etc.

The polymer of the silicon hydride used in the present invention can be obtained as a polymer of a polysilane, for example cyclopentasilane, by polymerizing the cyclic silane, for example cyclopentasilane, obtained in the above-mentioned manner. The polymerization may be performed by a method using a catalyst or a method using thermal polymerization.

If the obtained polysilane is a polymer of cyclopentasilane, for example, it is obtained as a solution in the organic solvent of 1% by mass to 20% by mass. In this case, for example, a transparent solution is obtained even if the organic solvent (cyclohexane) solution of 13.5% by mass is obtained. The obtained polymer of the cyclopentasilane has a weight-average molecular weight of approximately 600 to 3000, and this gives the Mw/Mn ratio between the weight-average molecular weight Mw and the number-average molecular weight Mn of 1.03 to 1.55; thus, a polymer with a narrow molecular weight distribution is obtained.

The polymer can be obtained at a high yield in the range of 80 to 90%.

The obtained polysilane (silicon hydride polymer) product is obtained by removing volatile components by reducing pressure, and can be preserved dissolved in a solvent. Examples of the solvent for the polysilane include: a hydrocarbon-based solvent such as n-hexane, n-heptane, n-octane, n-decane, cyclohexane, cyclooctane, dicyclopentane, benzene, toluene, xylene, duren, indene, tetrahydronaphthalene; decahydronaphthalene or squalane; an ether-based solvent such as dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-Dimethoxyethane, bis(2-methoxyethyl)ether, or p-dioxane; and furthermore propylene carbonate, γ-butyrolactone, N-methyl-2-pyrrolidone, dimethyl formamide, acetonitrile, dimethyl sulphoxide, etc. Among the above-mentioned examples of the solvent, cyclooctane is preferably used, and a polysilane composition can be formed by causing cyclooctane to contain the polysilane in the amount of 5 to 8% by mass.

In a method of forming a film of an oxide of the silicon hydride or the polymer thereof in the present invention, an organic solvent containing the oxide of the silicon hydride or the polymer thereof is applied onto a substrate, and heat treatment or the like is performed thereon; thereby, an oxide film is obtained. The coating is performed using a device for spin coating, roll coat, dip coat or the like, and after the coating, heat treatment may be performed. For example, spin coating is performed with the number of rotation of a spinner being set to 500 to 1000 rpm. The coating process is preferably performed in the atmosphere. Also, it may be performed in a nitrogen gas, a helium gas, an argon gas or another gas.

The coated substrate may be used without being undergoing heat treatment, but also may undergo heat treatment, and the process may be performed at a heating temperature of 20 to 500° C. or preferably 100 to 425° C. for 10 to 20 minutes.

The film thickness of the thus-obtained silicon hydride oxide-film is in a range of 60 to 100 nm.

Examples of the substrate include: a transparent electrode such as quartz, glass or ITO; a metal electrode such as gold, silver, copper, nickel, titanium, aluminum or tungsten; a glass substrate; plastic substrate; etc.

EXAMPLES

The weight-average molecular weight can be measured by gel permeation chromatography (GPC) (measurement equipment: HLC-8320GPC (manufactured by Tosoh Corporation); column: GPC/SEC (PLgel 3 µm, 300×7.5 mm, manufactured by Varian Inc.); column temperature: 35° C.; detector: RI; flow rate: 1.0 ml/minute; measurement time: 15 minutes; eluent: cyclohexane; injection amount: 10 µL); sample concentration: 1.0% (in cyclohexane). Also, with CPS (Mw150, RT=11.040 minutes), CPS-dimer (Mw298, RT=10.525 minutes) and CPS-Trimer (Mw446, RT=9.725 minutes) as primary standards, a calibration curve was generated. Si—H % was defined in the following manner using the peak at 2100 $cm^{-1}$ as Si—H and the peak at 1100 $cm^{-1}$ as Si—O by IR measurement. Calculation performed was: Si—H %=(integrated value of Si—H)/(integrated value of Si-H+integrated value of Si—O)×100. IR analysis was performed after removing a solvent by concentration.

Synthesis Example 1

Synthesis of Decachlorocyclopentasilane

In nitrogen atmosphere, decaphenylcyclopentasilane (500.0 g) and cyclohexane (453.7 g) were put into a 2 L-reaction flask as a solvent. After aluminum chloride $AlCl_3$ (14.7 g) was added to it, the temperature of the resultant mixture was raised to room temperature in a water bath. A hydrogen chloride HCL gas was blown on it for 8 hours. Thereafter, after pressure reduction and pressure recovery by means of nitrogen were repeated ten times to remove hydrogen chloride, the resultant mixture was filtered using a membrane filter; thereby, a cyclohexane solution of decachlorocyclopentasilane (1099.5 g) was obtained.

Synthesis Example 2

Synthesis of Cyclopentasilane

Solvent removal was performed on the cyclohexane solution of decachlorocyclopentasilane (1099.5 g) obtained in Synthesis Example 1, and thereafter the resultant mixture was distilled; thereby, decachlorocyclopentasilane (268.56 g) from which cyclohexylbenzene was removed was obtained. Cyclohexane (814.5 g) was added to and dissolved in it, and then the resultant fixture was filtered using a membrane filter, and rinsed using cyclohexane (50 g); thereby, a cyclohexane solution of high-purity decachlorocyclopentasilane (1100.6 g) was obtained. This was put into a 2 L-reaction flask in argon atmosphere, and at 0 to 10° C., a diethyl ether ET2O (269.6 g) solution of hydrogenated aluminum lithium $LiAlH_4$ (57.5 g) was dripped over 2 hours. After the resultant mixture was agitated at room temperature for 1 hour, at 0 to 10° C., ion-exchanged water (592.7 g) was dripped onto the reaction solution over 1 hour. After being agitated and allowed to stand still, water layer parts were removed. Subsequently, ion-exchanged water (592.7 g) was added to it at room temperature, and this rinsing operation was performed four times. Thereafter, the organic layer was dried using magnesium sulfate (23.7 g), and then filtration using a membrane filter and concentration were performed to obtain a reaction mixture (71.8 g) containing cyclopentasilane. By distilling and purifying the obtained cyclopentasilane, cyclopentasilane (53.74 g) was obtained.

Synthesis Example 3

Synthesis of Rh Black

In nitrogen atmosphere, a rhodium chloride n hydrate (1.00 g), ammonium carbonate (0.48 g) and ion-exchanged water (482 ml) were put into a 1-L reaction flask. Then, the temperature was raised from room temperature to 90° C. over 30 minutes. A hydrazine n hydrate (9.65 ml) was added and the resultant mixture was agitated at 90° C. for 25 minutes. Thereafter, the temperature was lowered to a temperature no greater than 30° C. while agitation was being performed, and the solution was allowed to stand still overnight to precipitate Rhblack. After 400 ml of the supernatant was fractionated, the remaining portions were separated from water by a centrifugal separator (2000 rpm), and were moved into a flask and dried in vacuum overnight. The dried Rhblack (rhodium black) was ground down in a mortar made of agate, and the amount of the obtained Rhblack was 0.45 g.

Synthesis Example 4

Synthesis of Cyclopentasilane Polymer

In argon atmosphere, the Rh black obtained in Synthesis Example 3 (150.7 mg) was prepared, and cyclopentasilane obtained in Synthesis Example 2 was added (49.95 g). This reaction mixture was agitated for 3 hours and a half. Then, 321.5 g of cyclohexane was added and the reaction was terminated. Then, the mixture solution was filtered using a membrane filter made of PTFE (polytetrafluoroethylene). Then, the obtained filtrate was moved into an eggplant flask and concentrated. Thereby, 41.94 g of a product was obtained. Measurement of GPC gave Mn=1,038 and Mw=1,287. Also, the amount of residual unpolymerized cyclopentasilane was 14.7%.

Example 1

Figure 2:
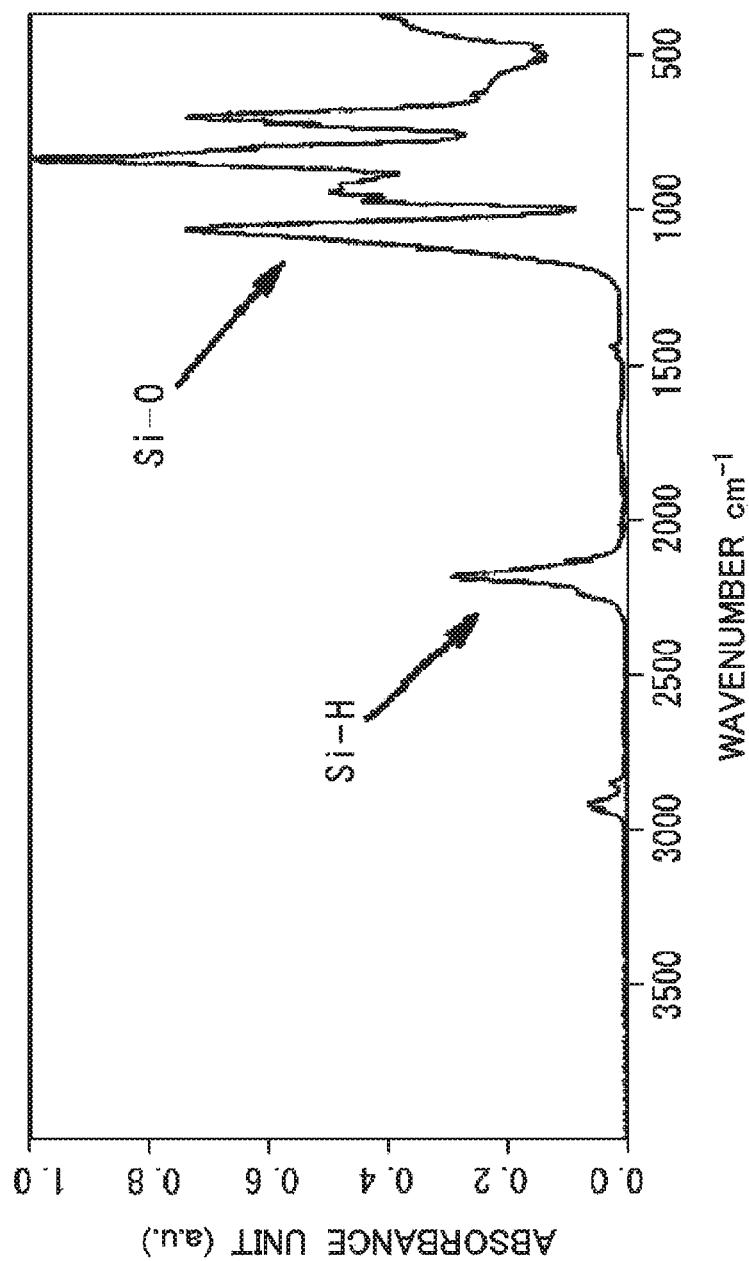
FIG. 2 shows an IR (infrared absorption spectrum) chart after oxidation of cyclopentasilane polymer in Example 1.
Figure 3:
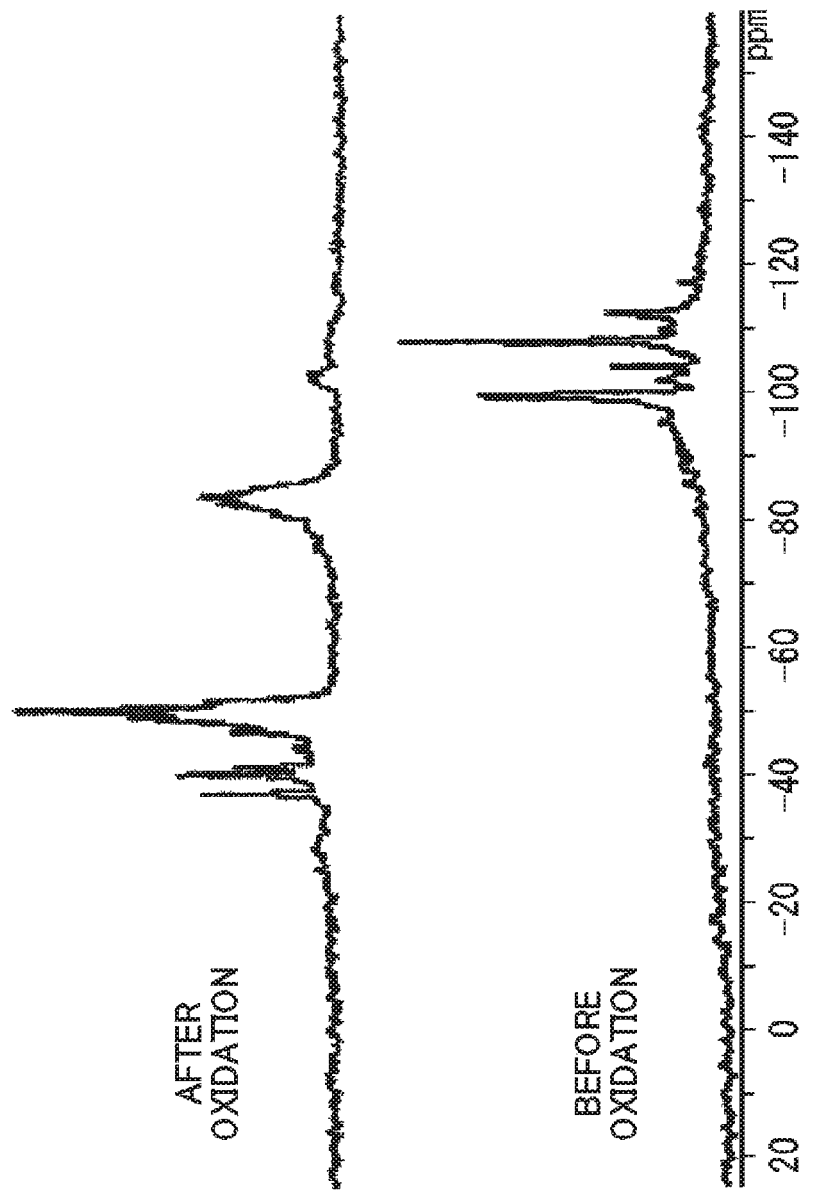
FIG. 3 shows $^{29}$Si-NMR spectrums before and after oxidation of cyclopentasilane polymer in Example 1.

In argon atmosphere, the cyclopentasilane polymer (4.0 g) obtained in Synthesis Example 4 was dissolved in cyclohexane/cyclooctane (weight ratio: 95/5, 96.0 g), and a solution of 4% by mass was prepared. High-purity air was blown on a cyclohexane/cyclooctane solution (20.0 g) containing this cyclopentasilane polymer in the amount of 4% by mass at 100 ml/minute for six hours, and the solution was oxidized. The IR charts before and after oxidation are shown in FIG. 1 (before oxidation) and FIG. 2 (after oxidation). The obtained solution was colorless and transparent, and IR measurement performed showed that the amount of Si—H groups remaining in the polymer after oxidation was 25.3 mol % relative to Si—H groups remaining in the polymer before oxidation. The $^{29}$Si-NMR spectrums before and after oxidation are shown in FIG. 3.

Example 2

In argon atmosphere, the cyclopentasilane (4.0 g) obtained in Synthesis Example 2 was dissolved in cyclohexane (96.0 g), and a solution of 4% by mass was prepared. High-purity air was blown on a cyclohexane solution (10.0 g) containing this cyclopentasilane in the amount of 4% by mass at 50 ml/minute for six hours, and the solution was oxidized. The obtained solution was colorless and transparent, and IR measurement performed showed that the amount of Si—H groups remaining in the polymer after oxidation was 26.9 mol % relative to Si—H groups remaining in the polymer before oxidation.

INDUSTRIAL APPLICABILITY

A method of producing a silicon hydride oxide-containing organic solvent (coating solution) with which a silicon hydride oxide coating film can be formed on a substrate is provided. Using the silicon hydride oxide-containing organic solvent makes it unnecessary to place a coating solution in non-oxidizing atmosphere at the time of coating of the substrate or to perform heat treatment on the substrate after the coating because a silicon hydride oxide is formed in the coating solution before the coating. The oxide coating film on the substrate can be used as an electrical insulating film.

What is claimed is:

1. A method of producing a silicon hydride oxide-containing solvent comprising:

obtaining a cyclic silane expressed by Formula (3):

$(SiH_2)_n$      Formula (3)

where n is an integer of 4 to 6, or a polymer thereof, wherein obtaining the cyclic silane expressed by Formula (3) comprises:

reacting a cyclic silane expressed by Formula (1):

$(SiR^1R^2)_n$      Formula (1)

where $R^1$ and $R^2$ independently indicate a hydrogen atom, a phenyl group, or a substituted phenyl group, but where both $R^1$ and $R^2$ are not hydrogen atoms, and n is an integer of 4 to 6, with a hydrogen halide in an organic solvent in the presence of an aluminum halide to obtain a solution containing a cyclic silane: expressed by Formula (2):

$(SiR^3R^4)_n$      Formula (2)

where each of $R^3$ and $R^4$ indicates a halogen atom, and n is an integer of 4 to 6, then after obtaining the solution containing the cyclic silane expressed by Formula (2), performing a distillation on the solution, and then reducing the cyclic silane expressed by Formula (2) with hydrogen or a lithium aluminum hydride to form the cyclic silane expressed by Formula (3); and blowing an oxygen-containing gas through an organic solvent containing the cyclic silane expressed by Formula (3) or a polymer thereof, wherein the polymer of the cyclic silane expressed by Formula (3) is obtained by polymerizing the cyclic silane expressed by Formula (3).

2. The method according to claim 1, wherein the silicon hydride comprises cyclopentasilane.

3. The method according to claim 1, Wherein the silicon hydride oxide contains a proportion of (residual Si-H groups)/(Si-H groups before oxidation) of 1 to 40 mol %).

4. The method according to claim 1, wherein the organic solvent contains the polymer of the cyclic silane expressed by Formula (3).

5. The method according to claim 1, wherein the oxygen-containing gas is air.

6. The method according to claim 4, further comprising generating the polymer of the cyclic silane expressed by Formula (3) by contacting the cyclic silane expressed by Formula (3) with metallic rhodium in an inert atmosphere.

7. The method according to claim 1, wherein the organic solvent contains the cyclic silane expressed by Formula (3).

8. The method according to claim 1, wherein each of $R^1$ and $R^2$ indicate the phenyl group.

9. The method according to claim 8, wherein the cyclic silane expressed by Formula (1) is reacted with the hydrogen halide in cyclohexane, and the solution further includes cyclohexylbenzene.

10. The method according to claim 2, wherein each of $R^1$ and $R^2$ indicate the phenyl group.

11. The method according to claim 10, wherein the cyclic silane expressed by Formula (1) is reacted with the hydrogen halide in cyclohexane, and the solution further includes cyclohexylbenzene.

12. The method according to claim 4, wherein each of $R^1$ and $R^2$ indicate the phenyl group.

13. The method according to claim 12, Wherein the cyclic silane expressed by Formula (1) is reacted with the hydrogen halide in cyclohexane, and the solution further includes cyclohexylbenzene.

14. The method according to claim 1, wherein the hydrogen halide is hydrogen chloride.

15. The method according to claim 10, wherein the aluminum halide is aluminum chloride.

16. The method according to claim 11, wherein each of $R^3$ and $R^4$ is chlorine.

* * * * *